United States Patent [19]

Abbondanti et al.

[11] 4,203,040
[45] May 13, 1980

[54] FORCE COMMUTATED STATIC ISOLATOR CIRCUIT

[75] Inventors: Alberto Abbondanti; Eric J. Stacey, both of Penn Hills, Pa.

[73] Assignee: Westinghouse Electric Corp., Pittsburgh, Pa.

[21] Appl. No.: 921,022

[22] Filed: Jun. 30, 1978

[51] Int. Cl.² .......................................... H03K 17/68
[52] U.S. Cl. ............................ 307/65; 307/252 M; 307/252 T; 361/100; 323/24
[58] Field of Search .......... 307/252 M, 252 Q, 252 N, 307/252 T, 65, 71, 242; 363/54; 361/100, 7; 323/24

[56] References Cited
U.S. PATENT DOCUMENTS

| 3,723,816 | 3/1973 | Pollard | 307/252 Q X |
| 3,725,742 | 4/1973 | Pollard | 307/252 M X |
| 3,737,759 | 6/1973 | Pollard | 363/138 |
| 3,921,038 | 11/1975 | Kernick et al. | 361/100 |

Primary Examiner—Michael L. Gellner
Assistant Examiner—James L. Dwyer
Attorney, Agent, or Firm—C. M. Lorin

[57] ABSTRACT

The invention provides a bilateral static isolator which is activated by "soft" forced commutation. Between two points in the power line to be interrupted are connected two thyristors in series-opposition, thus cathode to cathode. In antiparallel with each thyristor is mounted a diode. Thus, the two diodes appear in series opposition between the two power line points. A resonant circuit is applied to the conducting thyristor in order to turn it off with a relatively small reverse voltage. This voltage is obtained by resonant discharge of a precharged capacitor C through an inductor L and a diode D connected in reverse with the thyristor. The forward voltage drop of the diodes appears in reverse across the thyristors from the instant the discharge current rises above the line current until the instant the discharge current drops below the level of the line current. It is during this interval that the thyristor is provided with "soft" reverse bias. Subsequently the net current reverses again. With the thyristor now recovered, and the diode blocking, the current flows through the other diode and returns by the commutating branch associated therewith.

8 Claims, 6 Drawing Figures

FORCE COMMUTATED STATIC ISOLATOR CIRCUIT

BACKGROUND OF THE INVENTION

The invention relates to bilateral static controlled power switches in general, and more particularly to those of the forced commutation type, used where flow of power, AC or DC, may be occurring in opposite directions.

In a bilateral thyristor switch, two thyristors are provided, each associated with one direction of power flow. One of them is to be "open" whenever interruption is required for the particular direction. This function is particularly important in an uninterruptible power system (UPS) installation. In a UPS installation, energy is supplied to a critical load by a group of redundant inverter power supplies.

Static isolators are used in conjunction with the static inverter AC power supplies, mainly when a number of such power supplies operate in parallel feeding a common output bus in a UPS (Uninterruptible Power Supply) system.

Such systems are intended to provide AC power to a "critical bus", feeding loads that cannot stand power outages such as can occur with a regular commercial power source. In case of power outage, the critical bus remains energized through the UPS system, which then draws its input power from storage batteries. Reliability of operation of the UPS system is an essential requirement. For this reason, the UPS system is sometimes composed of a number of separate inverter units, operating in parallel. When more units are provided than required to meet the system total rating requirements, the system is said to have "redundancy". Each inverter is redundant, meaning that in case of failure of one inverter unit, it can be disconnected from the critical bus without impairing the system's rating.

In order to separate a failing inverter from the critical bus (thereby preventing it to draw damaging fault current from the other units and jeopardizing the supply of power to the critical load) efficient disconnect facilities must be provided by switches. Electromechanical disconnect switches are not adequate for this function, because their inherently slow response makes it improbable to limit below damaging levels the fault current drawn from the still healthy inverter units. Similarly, fused disconnect arrangements are too slow, unless means for forced fuse clearing are used; however, even in this case, the fact that a disconnection by fuse clearing is not resettable is an objection.

The isolator switch on each power supply must be capable of providing a rapid disconnection of a faulty inverter in order to protect the bus line. Forced commutation is in order for such prompt interruption. At the same time, low cost requires to avoid passive elements in the power path. In all events reliability is essential, which calls for a simple activation procedure. These goals have not been totally achieved in the past.

In AC systems, one of the ways of implementing the switching function via static semiconductor devices consists of using a pair of back-to-back thyristors which, when effecting the function of a switch in the ON (connecting) state, have their gates energized by a steady forward gate drive signal. When it is desired to turn the switch into the OFF state, the gate drive is suppressed to both thyristors. The device that was conducting current at the time of gate signal removal will keep conducting until the current through it reverses polarity due to the AC nature of the power source. Following this moment, the antiparallel thyristor device which would normally assume conduction of the load current when the isolator switch is in the ON state, will fail to do so due to the absence of gate drive, causing the circuit to become open. Such system is said to be a "naturally commutated" static switch. The great simplicity inherent to this arrangement is counterbalanced by the existence of a response delay, due to the need of waiting until the current undergoes a natural zero crossover. This delay, which could at worst last as long as the half-period of the AC current wave, is in some cases excessive to warrant safe disconnection of a faulty inverter. Although significantly improving over the electromechanical switch situation, the naturally commutated static switch of FIG. 2 may still not be fast enough in a number of fault situations.

The two back-to-back thyristors could be replaced with semiconductor devices that can be turned off through a control electrode, such as transistors or GTO (gate turn off) thyristors. At any instant, the switch could then be quickly brought to the OFF state by properly driving the control electrode. However, this solution is presently not applicable to the case of high power static isolators due to the lack of semiconductor devices of adequate voltage and current rating.

Alternatively, it is known to associate the thyristors with additional circuitry allowing to artificially and rapidly reduce to zero the current through a conducting device at any desired moment, thereby extinguishing the device. This is the process of forced commutation of a thyristor. In force commutated static isolators, the time delay inconvenience inherent of naturally commutated static isolators is eliminated at the expense of added circuitry to obtain the forced commutation effect and at the expense of providing thyristors apt to be quickly extinguished. The novel circuit configuration according to the present invention implements a force commutated static isolator.

In practice, from the standpoint of the speed of power flow interruption, the function of the switch is best implemented through static means, i.e., by using semiconductor devices that are brought to their conducting state when the switch is supposed to be closed and caused to block the flow of load current when the switch is supposed to be open. The semiconductor devices' arrangement implementing the switching function is called here a "static isolator".

Forced commutation is known in two forms, "hard" and "soft". While "hard" commutation implies that subsequent to a rapid forcing of the current to zero, a substantial reverse voltage is applied across the thyristor, "soft" commutation supposes that a conducting thyristor is turned off by gradually reducing its forward current to zero at a rate well below the thyristor di/dt rating, and then applying a very modest reverse voltage to the extinguishing thyristor. Such low reverse voltage is generally the forward drop across a device in antiparallel connection with the thyristor. Hard commutation calls for connecting a precharged commutating capacitor across the device by means of gating an auxiliary switching device. Current then is commutated from the thyristor into the capacitor branch at a rate controlled by the inductor L in the circuit. When the thyristor ceases to conduct, the "hard" capacitor voltage appears in reverse across the thyristor and in series with the system voltage, resulting in the first drawback of hard commutation: since the system voltage is boosted by the capacitor voltage, the fault current rises even faster (and therefore higher) until the capacitor voltage reverses. A second drawback of hard commmutation in this basic form is that the load impedance starts depleting capacitor charge from the moment the commutating branch is activated. Consequently, a larger capacitor is required to provide the necessary reverse bias time. Another drawback of hard commutating circuits is that inductance in circuit has the function of limiting rate-of-rise of current (di/dt) through the discharge circuit and not to "tune" the discharge circuit. The presence of an inductance actually "degrades" the circuit since reverse biasing of the thyristor does not start until after the entire line current is commutated by the capacitor; and by this time a non-negligible charge has been depleted.

Typical of an isolator switch interrupted by "hard" forced commutation in the prior art are the circuits shown in U.S. Pat. Nos. 3,737,759 and 3,921,038.

An object of the present invention is to overcome the above-stated drawbacks due to "hard" commutation.

Another object of the invention is to also provide a bilateral static isolator which is commanded by "soft" forced commutation.

A further object of the invention is to provide a force commutated static isolator that can be used in an uninterruptible power system to isolate any particular inverter of such system.

A further object is to provide an isolator without requirement of elaborate signal sensing prior to activation.

The technical and commercial constraints specific to a UPS make it important that the circuit arrangement to be used have as many as possible of the following characteristics: The number of power components must be small in order to ensure reliability. The number of semiconductor junctions bearing current in continuous duty should be kept to a minimum to reduce the power losses and the cooling requirements. Passive components in the path of the steady-state load current should be avoided, to eliminate the cost penalty, the losses and the voltage drop associated with such practice. The mechanism of activation of the circuit should have a rugged simplicity for the sake of the system's reliability. This requirement of reliability actually dominates all other considerations since the static isolator, as part of a UPS system, must in the final analysis ensure an overall reliable source of power. In this respect, the prerequisite of reliability in a static isolator has two aspects: not only must the system be capable of performing its isolating function when required to do so, but it must also be immune to untimely, erratic triggering when no disconnect action is desired, i.e., under normal operation and in absence of fault conditions. As a matter of fact, untimely activation of a static isolator due to malfunction in the control circuitry may well occur with a far higher probability than the failure of the isolator itself in performing its protective function. Since the unintentional activation of static isolators can result in the collapse of the critical bus voltage, it is an unacceptable occurrence for a UPS system. For this reason, it is desired to decrease the isolator's vulnerability to control failure and adopt a system that does not require elaborate current sensing the decision making logic to perform its intended function.

SUMMARY OF THE INVENTION

The invention provides a bilateral static isolator which is activated by "soft" forced commutation. Between two points in the power line to be interrupted are connected two thyristors in series-opposition, thus cathode to cathode. In antiparallel with each thyristor is mounted a diode. Thus, the two diodes appear in series opposition between the two power line points. A resonant circuit is applied to the conducting thyristor in order to turn it off with a relatively small reverse voltage. This voltage is obtained by resonant discharge of a precharged capacitor C through an inductor L and a diode D connected in reverse with the thyristor (FIG. 3). The forward voltage drop of the diodes appears in reverse across the thyristors from the instant the discharge current rises above the line current (i.e., the net current through the respective half of the switch reverses and is forced to flow through the diode), until the instant the discharge current drops below the level of the line current. It is during this interval that the thyristor is provided with "soft" reverse bias. Subsequently, the net current reverses again. With the thyristor now recovered, and the diode blocking, the current flows through the other diode and returns by the commutating branch associated therewith. The function of the inductance in soft commutating circuits is to "tune" the resonant discharge of the force commutating circuit so as to obtain a sufficiently high and wide current pulse to provide the required turn-off time. Thus, the presence of an inductance does not degrade the circuit as it would in a hard commutating situation.

DESCRIPTION OF THE PREFERRED EMBODIMENTS

Figure 1:
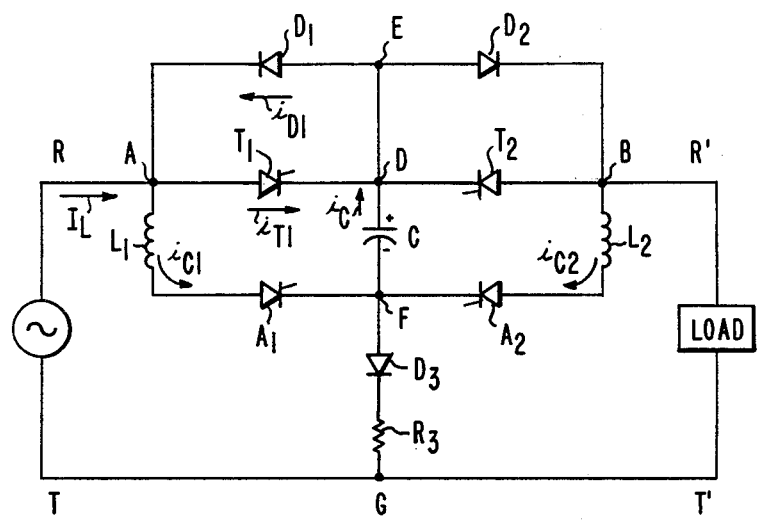
FIG. 1 shows the basic configuration of the force commutated bilateral static isolator according to the present invention.

Referring to FIG. 1, the disclosed circuit includes two main thyristors $T_1$ and $T_2$ connected cathode-to-cathode. The thyristor assembly is inserted in series with the RR' line connecting an AC source S, which could be a static inverter, to an AC load L, which could be the critical bus of a UPS system. In antiparallel connection with each thyristor, there is a diode $D_1$ ($D_2$). Thyristors $T_1$ and $T_2$ are normally kept with their gate energized for forward conduction. When the load current $I_L$ flows in the positive direction as determined by the conventional orientation of arrow (1), the current path is RADEBR', with $T_1$ and $D_2$ bearing the load.

When the load current flows in the negative direction, $T_2$ and $D_1$ carry the load which flows along the path R'BDEAR.

Two commutation loops are provided, namely AFDA and BFDB. Each commutation loop includes an auxiliary thyristor ($A_1$, $A_2$) and a commutation inductor ($L_1$, $L_2$). A commutation capacitor C is provided in branch DF common to the two commutation loops. A charging branch FG is provided for capacitor C via a low rating diode $D_3$ and a resistor $R_3$. Thus, the capacitor and its charging circuit are connected across the AC source or between two lines RR' and TT' of a multiphase system. In this manner, the capacitor is charged in the steady state with a DC voltage equal to the crest value of the AC source's line-line voltage, and with the polarity as shown in FIG. 1.

When it is desired to disconnect the AC source from the load, the gating signals to $T_1$ and $T_2$ are suppressed. Simultaneously, auxiliary thyristors $A_1$ and $A_2$ are triggered ON. This initiates the resonant discharge of capacitor C via the two commutation loops, leading to the reversal of the polarity of the capacitor's voltage. The capacitor discharge current $i_C$ (curve (a) of FIG. 2 where thyristor $T_1$ is conducting) assumes the form of a half sine wave, which splits evenly between the two loops, through which half sine current pulses $i_{C1}$ (curve (e)) and $i_{C2}$ (curve (c)) flow.

Figure 2:
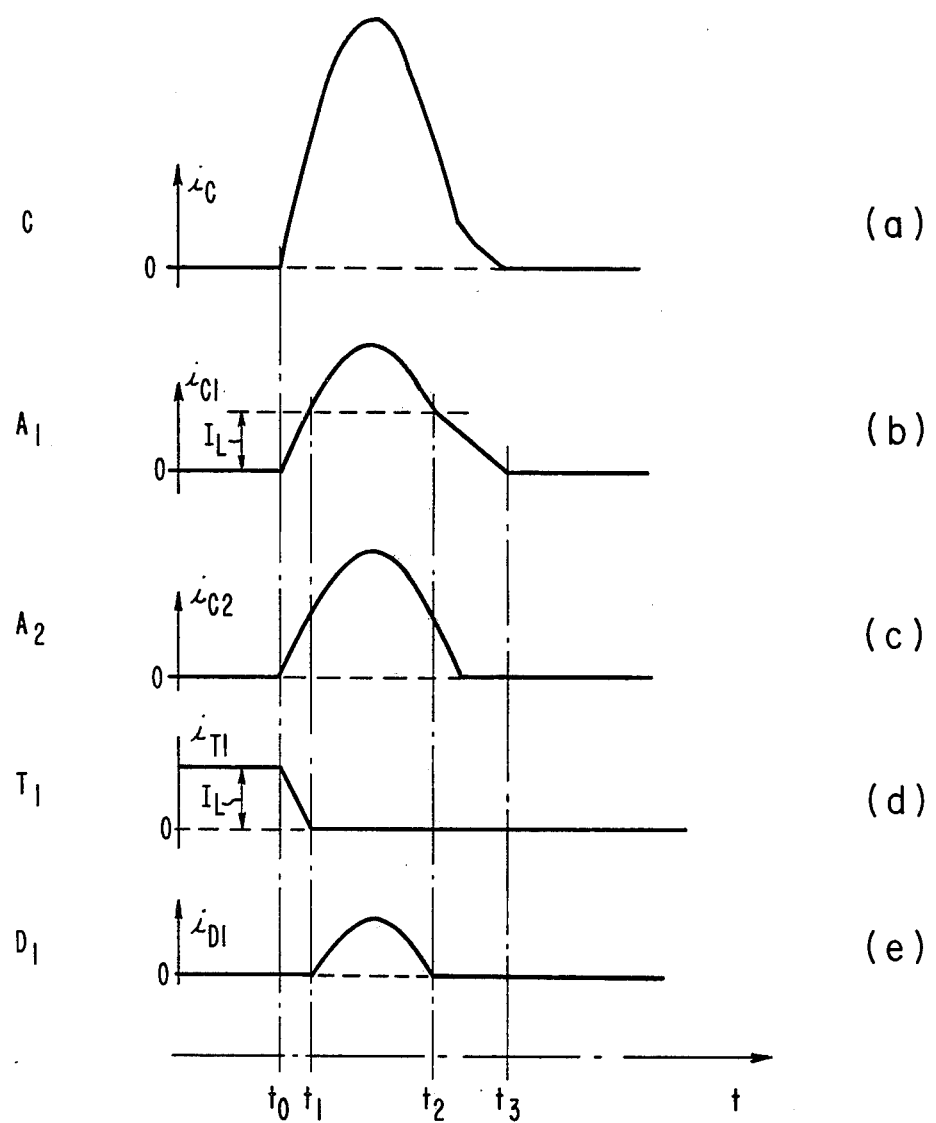
FIG. 2 illustrates with five curves the commutation process when the static isolator according to the invention is triggered.

Assuming that at the instant of activation $t_0$ the load current is positive and has a level $I_L$ (see curve (b) of FIG. 2), then sine pulse $i_{C1}$ (curve (b)) initially flows through $T_1$ in the reverse direction, superimposed on the forward current $I_L$. The net current $i_{T1}$ (curve (d)) through $T_1$ is the difference between these two components and decays to zero as the sine pulse $i_{C1}$ builds up. At time $t_1$ when the current $i_{C1}$ has reached the value $I_1$, the current becomes zero through $T_1$. The sine pulse $i_{C1}$ continues to build up flowing now through diode $D_1$, which carries a net current $i_{D1}$ (curve (e)) equal to the tip of the sine pulse $i_{C1}$ exceeding the level $I_L$. As long as $D_1$ carries current, its forward voltage drop is applied to $T_1$ as reverse bias, allowing this device to turn off. As the sine pulse $i_{C1}$ goes through its crest and starts decaying again, the net current $i_{D1}$ decreases and becomes zero at time $t_2$, when again $i_{C1} = I_L$. From this moment on, the reverse bias to $T_1$ ends as $D_1$ ceases bearing current. Thus, the circuit must be designed to ensure that the interval $t_2 - t_1$ last sufficiently long to ensure recovery of the commutated device $T_1$. This condition can be attained by proper sizing of $L_1$, $L_2$ and C.

After time $t_2$, if thyristor $T_1$ has recovered, the main path for the load current is interrupted, since $T_1$ can now block forward voltage and $D_1$ cannot conduct positive load current. The isolator circuit has thus performed its function, in a time delay $t_2 - t_1$ comparable in magnitude to the typical recovery of time of a thyristor. If fast recovery thyristors are used, the activation delay can be very short.

Transients of secondary importance take place after $t_2$. The load current seeks to flow through secondary path RAFDEBR', forced by the energy stored in $L_1$ and the inductive component of the AC source impedance. But in doing so, the load current must buck the voltage of capacitor C, which is now reversed in polarity. This results in a rapid decay of the current in the secondary branch, and at time $t_3$ and net current through the isolator becomes zero.

During this time, the second component $i_{C2}$ (curve (c)) of the capacitor current $i_C$ circulates in loop DEBFD, flowing entirely through diode $D_2$, without playing any useful role in the commutation process. Its shape is a near sine pulse, ending shortly before $t_3$. If the initial assumption were that the load current $I_L$ was negative, then the roles of $T_1$, $D_1$, $L_1$, $i_{C1}$, $i_{D1}$, $i_{T1}$ would be exchanged with the ones of $T_2$, $D_2$, $L_2$, $i_{C2}$, $i_{D2}$, $i_{T2}$ in the above description and in FIG. 2, with the $i_{C2}$ pulse performing the commutation process and the $i_{C1}$ pulse idly free-wheeling.

The proposed circuit does not require the presence of discrete passive components in the load current path. It is also characterized by a simple mechanism of activation. It is sufficient to trigger auxiliary thyristors $A_1$ and $A_2$ (possibly from a common gate signal source) to initiate the commutation, independently from the direction of current flow. In some prior art circuits, it is necessary to detect the current direction and accordingly set the gating strategy which involves the use of vulnerable logic circuitry.

Some may also consider an advantage of this circuit the fact that it uses "soft" commutation. Soft commutation circuits are characterized by the fact that the rate of decay of the current in the thyristor being commutated is moderate and that the reverse bias voltage during recovery is very low. These circuits operate by forcing a pulse of reverse current through the commutated thyristor and through an antiparallel diode or thyristor. By contrast, "hard" commutation circuits such as in the prior art apply a sudden reverse bias of large value to the thyristor. This results in steep rates of decay of forward current in the commutated device. It can be shown that hard commutation requires a larger size of commutation capacitor; furthermore, other system disadvantages have been attributed to hard commutation in static isolators. It also appears, today, that the most advanced high rating, fast turn-off thyristors are tailored for soft commutation.

It should also be pointed out that the advantage of simplicity of operation is obtained at the cost of circulating an idle half of the capacitor current through the diode in antiparallel with the non-conducting thyristor; this may adversely affect the size and cost of the commutation capacitor C; but the larger capacitor in counterpart tends to limit the voltages developed, thereby reducing thyristor voltage requirements.

Figure 3:
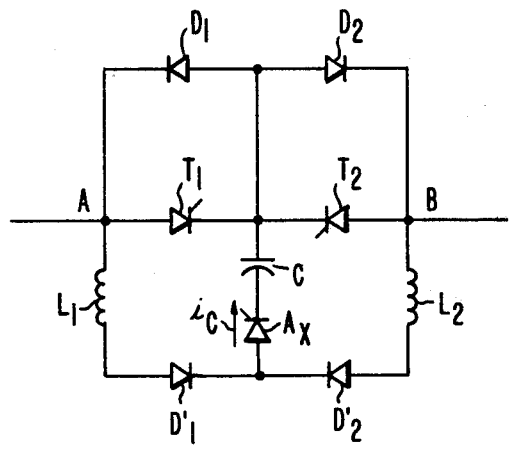
FIG. 3 shows a modification of the circuitry of FIG. 1 where a single auxiliary gating device is used in the commutation circuit.

The circuit of FIG. 1 may be modified as per FIG. 3. Here a single auxiliary thyristor A is used with two diodes, $D'_1$ and $D'_2$. The operation of the circuit and the sizing criteria for $L_1$, $L_2$ and C remain the same. The fact that there is not just one device to trigger for activation of the isolator increases the reliability. However, when the current rating of the isolator is high, a single thyristor $A_X$ cannot handle the very high current pulse $i_C$ required for a successful commutation. If two thyristors in parallel have to be used in location $A_X$ for reasons of rating, the solution of FIG. 1 is more advantageous.

Figure 4:
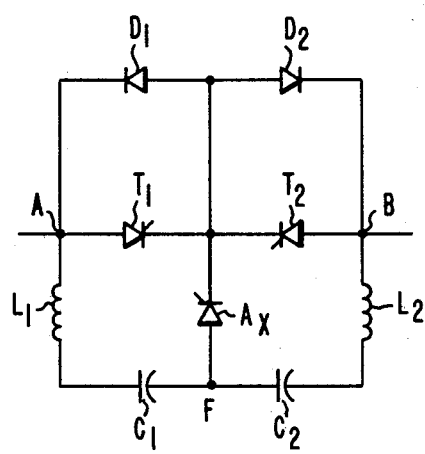
FIG. 4 shows another modification of the circuitry of FIG. 1.

FIG. 4 shows another modification derived from the circuit of FIG. 1. Here the commutation capacitor is split in $C_1$ and $C_2$, eliminating the need of semiconductors in the branch AFB to provide isolation. As a result, this circuit exhibits the lowest semiconductor device count in the family. This circuit is attractive for low power applications. When the isolator is OFF, the impedance between A and B is quite low at some frequencies, due to the components in branch AFB. However, the impedance across an isolator in the OFF state should actually approach infinity.

The circuit of FIG. 1 can be used with means for sensing the direction of load current flow and the gating of the auxiliary thyristors would be set accordingly. If a positive load current is sensed at the instant of activation, auxiliary thyristor $A_1$ is fired and $A_2$ is left in the OFF state. Conversely, if the current is sensed as being negative, $A_2$ is fired and $A_1$ left blocking. In such instance, the size of capacitor C can be reduced by a factor of two, because the "idle" current pulse no longer exists. Despite the fact that the addition of current direction discriminating circuitry and selective gating might affect the reliability of the system, this arrangement is attractive in many cases. The configuration remains unchanged, but the sizing criteria of $L_1$, $L_2$ and C change. It should be noted that the selective gating applies only to the gating of the auxiliary thyristors, and not to the gating of the main thyristors. In certain instances, selective gating may be applied in practice to the main thyristors as well.

Figure 5:
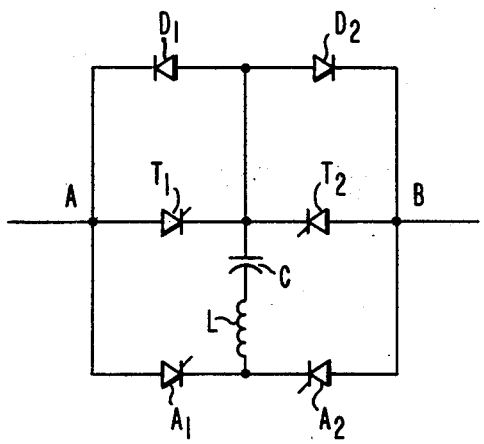
FIG. 5 is a circuit adapted from FIG. 1 for selective gating of one commutation circuit in relation to a selected main power device of the bilateral isolator of FIG. 1.

The circuit of FIG. 1, when selective gating is used, may be modified as per FIG. 5. Here a single inductor L is used for the two commutation loops. This modification is impractical without selective gating because it would be hard to ensure sharing of the commutation current between the two commutation loops.

The invention is most suitable for protection in uninterruptible power systems. In such installations, with a "primary" three phase output at 480 V with the inverters, ratings up to 428 KVA are not uncommon. With such a maximum rating, the static isolator should be designed to interrupt currents of up to 53 times the steady state rms rated current. The circuit of FIG. 1 is particularly suitable since it completely isolates the input from the output. Furthermore, using a simple control to determine when interruption is to take place without regard to the polarity of current, the voltage ratings of all elements are reduced. This reduction in voltage rating, not readily apparent, is due to the fact that the commutating capacitor has twice the value needed if current polarity was used to selectively fire the required commutating thyristor. This double capacitance absorbs the energy stored in the effective series leakage reactance of the inverter, while holding the consequent voltage overshoot to a considerably lower value. While at the high power rating, the use of smaller commutating thyristors in the chosen configuration of FIG.1 considerably reduces total device cost, for lower power ratings the arrangement of FIG. 3 may be preferred.

Figure 6:
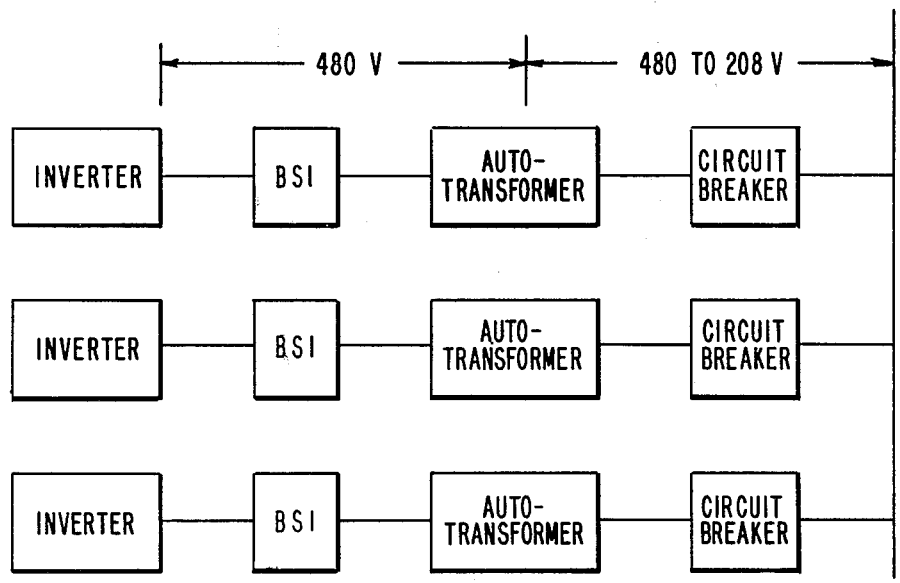
FIG. 6 illustrates with a three-phase circuit the application of the bilateral isolator switch according to the invention for the protection of a UPS against faulty inverters.

The general configuration of an uninterruptible power system typically with three parallel inverters is illustrated in FIG. 6. A bilateral static isolator (BSI), such as described hereinabove, is interposed between the inverter and the auto transformer of the system in each power line. Testing has shown that it is preferable to locate the bilateral switch in the 480 volts section, e.g., between the inverter and the auto transformer, rather than in the lower voltage section, e.g. at the secondary end of the auto transformer. The reason is that a thyristor can withstand the voltage and carry the current of the largest inverter in the section (say 400 VA), while it would be exposed to higher currents if placed in the 280 volt section. On the other hand, with force commutation, the stored energy in the auto transformer leakage inductance, and part of the inverter transformer leakage inductance stored energy must be absorbed in order to keep the voltage across the isolator within acceptable limits. This is taken care by a non-linear resistor disposed in parallel to the bilateral isolator so as to clamp the voltage level and dissipate the accumulated energy until the clamp level no longer exists.

the bilateral isolator according to the present invention is applicable to any power line in which energy is susceptible of flowing in either direction, for instance with a DC line, as well as with an AC line.

We claim:

1. Bilateral switch apparatus for interrupting the flow of electric power between two points of a power line, comprising:

first and second main static controlled switches connected in series-opposition between said two points and gated for conduction;

first and second diode means connected in series-opposition between said two points, each of said first and second diode means forming an antiparallel network with one of said first and second main switches and forming a series-conducting network with the other of said first and second main switches; and force commutation means coupled with each of said antiparallel networks for providing soft commutation of a conductive one of said first and second main switches while withholding gating thereof.

2. The apparatus of claim 1 with said commutation means including at least one resonant circuit.

3. The apparatus of claim 2 with said commutation means including: storage means precharged while one of said first and second main switches is conductive; and statically controlled means for discharging said storage means resonantly across the conductive one of said first and second main switches with a current bucking action thereacross, and across the antiparallel one of said first and second diode means forwardly therethrough.

4. The apparatus of claim 3 with said discharging means including a first static controlled auxiliary switch and a second static controlled auxiliary switch, one of said first and second auxiliary switches being activated with respect to said conductive one of said first and second main switches; the other of said first and second auxiliary switches being actuated with respect to the series-connected one of said first and second diode means forwardly therethrough.

5. The apparatus of claim 3 with said discharging means including (a) said storage means and a first resonant network coupled with one of said antiparallel networks and (b) said storage means and a second resonant network coupled with the other of said antiparallel networks, at least one auxiliary static switch being provided for initiating resonant current discharges in the respective antiparallel networks.

6. The apparatus of claim 5 with an auxiliary diode being associated in each of said first and second resonant networks and forwardly coupled with said one auxiliary static switch.

7. The apparatus of claim 5 with said storage means including a first capacitor associated with said first resonant network and a second capacitor associated with said second resonant network; said one auxiliary static switch being common to said first and second resonant circuits and initiating the discharge of said first and second capacitors simultaneously therethrough.

8. An uninterruptible power system (UPS) having a plurality of inverters for supplying AC power to a load through corresponding power lines and a plurality of bilateral static isolators interposed in each of said power lines, respectively, each of said bilateral static isolators comprising: first and second main static controlled switches connected in series-opposition; first and second diode means connected in series-opposition, each of said first and second diode means forming an antiparallel network with one of said first and second main switches and forming a series-conducting network with the other of said first and second main switches; and force commutation means coupled with each of said antiparallel networks; the force commutation means of one of said bilateral isolators being triggered while withholding gating from the associated said first and second main switches for providing soft commutation of a conductive one of said first and second main switches to interrupt the flow of power in the corresponding power line, thereby to disconnect a faulty inverter.

* * * * *